(12) United States Patent
Lahaug et al.

(10) Patent No.: US 9,053,928 B2
(45) Date of Patent: Jun. 9, 2015

(54) WAFER AND FILM COATING METHOD OF USING THE SAME

(71) Applicant: Inotera Memories, Inc., Taoyuan County (TW)

(72) Inventors: Eric Lahaug, Bristow, VA (US); Chia-Ming Yang, Kaohsiung (TW); Regan Stanley Tsui, Falls Church, VA (US)

(73) Assignee: Inotera Memories, Inc., Taoyuan County (TW)

( * ) Notice: Subject to any disclaimer, the term of this patent is extended or adjusted under 35 U.S.C. 154(b) by 0 days.

(21) Appl. No.: 14/198,783

(22) Filed: Mar. 6, 2014

(65) Prior Publication Data

US 2014/0264774 A1    Sep. 18, 2014

(30) Foreign Application Priority Data

Mar. 13, 2013  (TW) .............................. 102108898 A

(51) Int. Cl.
| H01L 21/4763 | (2006.01) |
| H01L 29/00 | (2006.01) |
| H01L 29/06 | (2006.01) |
| H01L 21/02 | (2006.01) |

(52) U.S. Cl.
CPC ................................. *H01L 21/02271* (2013.01)

(58) Field of Classification Search
CPC .............. H01L 21/78; H01L 21/76802; H01L 21/76843; H01L 21/76808; H01L 21/76807; H01L 21/76804; H01L 21/76232
USPC .......... 438/462, 637, 638, 640; 257/513, 521, 257/618, 622
See application file for complete search history.

(56) References Cited

U.S. PATENT DOCUMENTS 7,928,507 B2 *   4/2011  Wang et al. .................... 257/330
2007/0010072 A1 *  1/2007  Bailey et al. ................... 438/478

\* cited by examiner

*Primary Examiner* — Hsien Ming Lee
(74) *Attorney, Agent, or Firm* — Rosenberg, Klein & Lee

(57) ABSTRACT

The present disclosure provides a wafer that can be used in coating films. The wafer includes a front surface, a back surface opposite to the front surface, and a plurality of trenches. The back surface further includes a central region and a surrounding region. The trenches are disposed on the back surface. The spacing between any two adjacent trenches in surrounding region is less than the spacing between any two adjacent trenches in the central region.

18 Claims, 3 Drawing Sheets

WAFER AND FILM COATING METHOD OF USING THE SAME

BACKGROUND

1. Technical Field

The invention relates to a coating method and the wafer utilized in the same, and in particular, to a wafer coating method and the wafer utilized in the same.

2. Description of Related Art

In the technology of the film coating, the common vapor coating method includes the method of chemical vapor-phase deposition and the method of physical vapor-phase deposition. The method of the chemical vapor-phase deposition is introducing the reacting gas into the reactor, such as reaction chamber, to react with the wafer and coating a film on the wafer.

While the batch reactor is utilized for the chemical vapor-phase deposition, the reacting gas would introduce from one of the terminals, and extract from the other terminal. However, the flow rate of the reacting gas is non-uniform in the reactor. For example, the flow rate of the gas in the inlet might higher than the flow rate of the gas in the outlet. The flow rate of the gas in the surrounding region of the wafer might higher than the flow rate of the gas in the central region of the wafer. Thus, the thickness of the film deposited on the wafer might non-uniform, and the quality of the wafer might decrease.

SUMMARY

The present invention provides a wafer with a plurality of the trenches. The wafer is utilized to film coating.

The present invention provides a wafer coating method. The wafer with a plurality of the trenches is utilized in the wafer coating method to enhance the uniformity of the coating film.

The present invention provides a wafer coating method. A partition with a plurality of trenches is utilized in the wafer coating method to enhance the uniformity of the coating film. The increase in surface area from center to edge on wafer backside produces a decrease in deposition rate from center to edge on the opposing wafer frontside to offset depletion related deposition rate profile non-uniformity.

The present invention provides a wafer utilizing in wafer coating. The wafer includes a right side, a back side corresponding to the right side, and a plurality of the trenches. The back side includes a central region and a surrounding region. The trenches exist on the back side of the wafer. The average distributed density of the trenches in the surrounding region is greater than the average distributed density of the trenches in the central region.

The present invention provides a wafer utilized in wafer coating. The wafer includes a right side, a back side corresponding to the right side, and a plurality of trenches. The back side includes a central region and a surrounding region. The trenches exist on the back side of the wafer. The spacing between any two of adjacent trenches in the surrounding region of the back side is smaller than the spacing between any two of adjacent trenches in the central region of the back side.

The present invention provides a wafer coating method. Firstly, a reactor is provided. The reactor includes an inlet and an outlet. Next, at least a first wafer and a plurality of second wafers are deposed in the reactor. The first wafer and the second wafers are arranged along the first axial. The first wafer includes a first right side, a second right side corresponding to the first right side, and a plurality of trenches. The first back side includes a central region and a surrounding region. The trenches exist on the first back side. In addition, each of the second wafers includes a second right side and a second back side corresponding to the second right side. The second right side faces to the first back side. Moreover, the spacing between any two of the adjacent trenches in the surrounding region is smaller than the spacing between any two of the adjacent trenches in the central region. Then, a reacting gas is introduced from the inlet to the reactor.

To sum up, the present invention provides a wafer and the wafer coating method utilizing the wafer. The wafer includes a right side, a back side and a plurality of trenches. The spacing between any two of the adjacent trenches in the surrounding region is smaller than the spacing between the any two of the adjacent trenches in the central region. While the wafer is utilized to coating, the structure of the trenches on the wafer might enhance the reacting area in the surrounding region. Thus, the thickness of the film in the surrounding region is decreased, and the uniformity quality of the wafer is enhanced.

In order to further appreciate the characteristic and technical contents of the present invention, references are hereunder made to the detailed descriptions and appended drawings in connection with the present invention. However, the appended drawings are merely shown for exemplary purpose rather than being used to restrict the scope of the present invention.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Figure 1A:
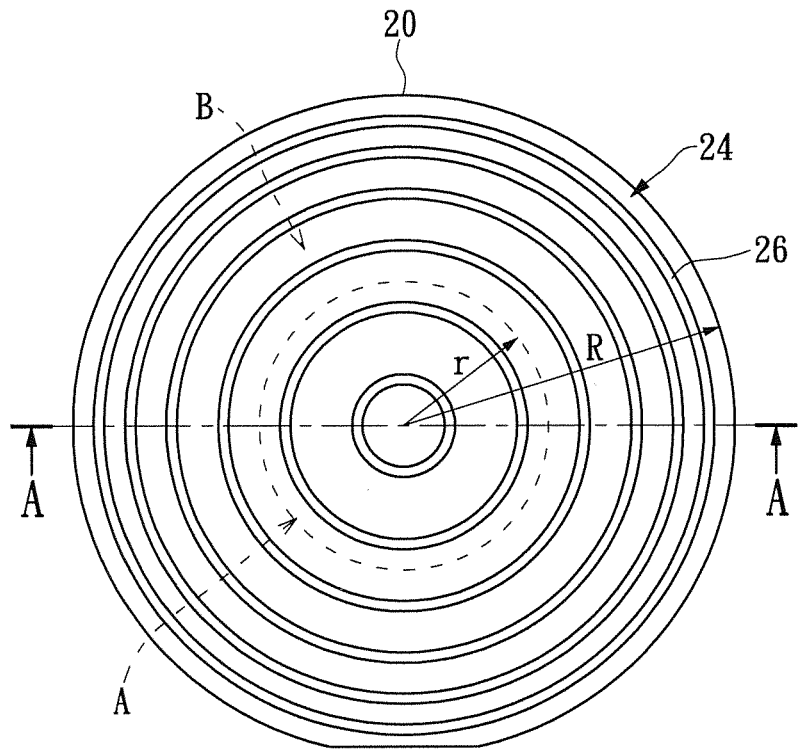
FIG. 1A is a structure chart of the first wafer in the present embodiment.

FIG. 1A is a structure chart of the first wafer 20 in the present embodiment. The first wafer 20 in the present invention is utilized in the wafer coating method. Referring to FIG. 1A, the first wafer 20 includes a first right side 22, a first back side 24 corresponding to the first right side 22 and a plurality of trenches 26. The first back side 24 includes a central region A and a surrounding region B. The surrounding region B surrounds the central region A. The center of the first wafer 20 is inside the central region A (as shown in FIG. 1A).

In the present invention, the first wafer 20 has a radius R, and the central region A has a radius r. The length of the radius r could be 70% less than the length of the radius R. In addition, the surrounding region B in the first wafer 20 is the region expect for the central region A. However, the present invention is not limited to the area of the central region A and the surrounding region B on the first wafer 20.

As shown in FIG. 1A, a plurality of the trenches 26 exist in the first back side 24. The trenches 26 are circular trenches with the same center. The spacing between any two of the adjacent trenches 26 in the surrounding region B would be smaller than the spacing between any two of the adjacent trenches 26 in the central region A. That is to say, the average distributed density of the trenches 26 in the surrounding region B of the first back side 24 is greater than the average distributed density of the trenches 26 in the central region A of the first back side 24. The definition to the average distributed density of the trenches 26 in the central region A is that the number of the trenches 26 in the central region A divides the area of the central region A. The definition to the average distributed density of the trenches 26 in the surrounding region B is that the number of the trenches 26 in the central region B divides the area of the central region B.

In addition, the spacing between any two of the adjacent trenches 26 is increased form the central region A to the surrounding region B. In other words, the average distributed density of the trenches 26 could be increased from the geometric center of the first back side 24 to outward. However, the present invention is not limited the shape of the trenches 26 and the distribution of the trenches 26 in the first back side 24.

Figure 1B:
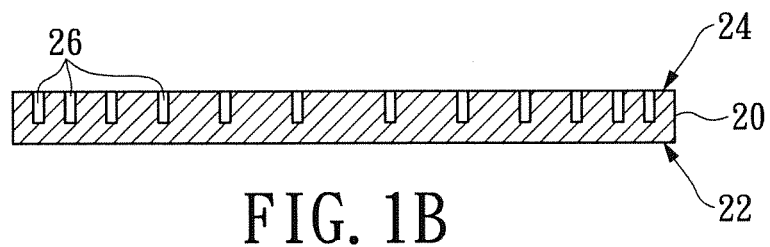
FIG. 1B is a cross-section view of the first wafer in the present embodiment.

FIG. 1B is a cross-section view of the first wafer in the present embodiment. FIG. 1B is a cross-section view taken along a line A-A shown in FIG. 1A. Referring to FIG. 1B, in the present invention, the depth of the trenches 26 are the same. In addition, the trenches 26 can be formed by the method of photolithography and etching. The method of etching includes dry etching and wet etching. Nevertheless, in other embodiment, the depth of the trenches 26 could increase from the central region A to the surrounding region B.

Figure 2:
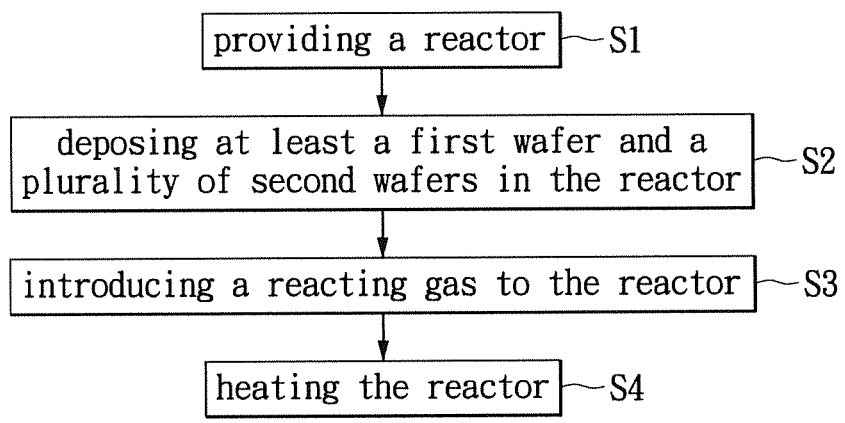
FIG. 2 is a flow chart of the present invention.
Figure 3:
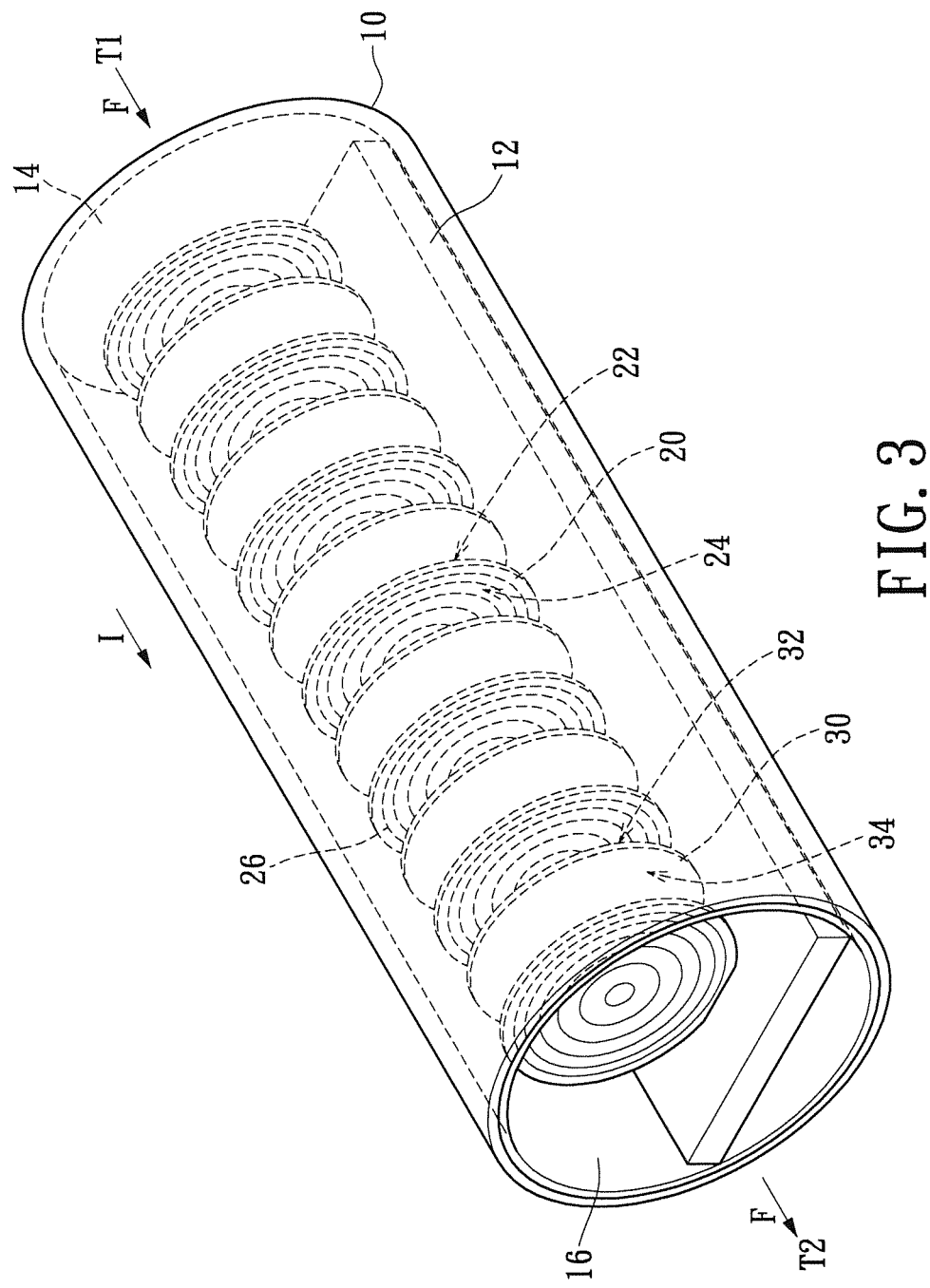
FIG. 3 is a structure chart of the wafer coating equipment in the present embodiment.

In the following paragraph, the wafer coating method utilized the first wafer 20 is introduced. FIG. 2 is a flow chart of the present embodiment. FIG. 3 is a structure chart of the wafer coating equipment in the present embodiment.

Referring to FIGS. 2 and 3, firstly, the step S1 is providing a reactor 10. The reactor 10 comprising a base 12, an inlet 14 and an outlet 16 corresponding to the inlet 14. The inlet 14 and the outlet 16 are arranged along the first axial. In the present invention, the reactor 10 is batch reactor. Nevertheless, the present invention is not limited to the type of the reactor.

Next, the step S2 is deposing at least a first wafer 20 and a plurality of second wafers 30 in the reactor 10. In the present invention, the number of the first wafer 20 is more than one. Specifically, the first wafers 20 and the second wafers 30 are arranged along the first axial, and deposed on the base 12. Each of the first wafers 20 includes a first right side 22 and a first back side 24 corresponding to the first right side 22. The first right sides 22 face to the inlet 14. In addition, each of the second wafers 30 includes a second right side 32 and a second back side 34. The second right sides 32 of the second wafers 30 are facing to the first back sides 24 of the first wafer 20.

It's worth noting that, the first right sides 22 or the second right sides 32 could be the right sides of the wafer. In other words, the first right sides 22 and the second right sides 32 could be the polished surface. The first back sides 24 or the second back sides 34 could be the back sides of the wafer. Moreover, the thickness of each of the first wafer 20 is in the range of 0.1 to 500 µm. The thickness of each of the second wafers 30 is in the range of 0.1 to 5000 nm. However, the present invention is not limited to the thickness of the first wafers 20 and the second wafers 30.

As shown in FIG. 3, in the present embodiment, one of the first wafers 20 could be deposited between the any two of the adjacent second wafers 30. Nevertheless, in other embodiment, the first wafers 20 could not be deposited between any two of the adjacent second wafers 30. In addition, the number of first wafers 20 deposited between any two of the adjacent second wafers 30 could more than one. The number of the first wafers 20 could be just one. The present invention is not limited to the deposition of the second wafers 30 and first wafers 20 and the number of the first wafers 20.

In addition, in the present invention, the first back sides 24 of the first wafers 20 face to the second right sides 32 of the second wafers 30. However, in other embodiment, the first back sides 24 of the first wafers 20 could also face to the second back sides 34 of the second wafers 30. The first right sides 22 of the first wafers 20 could face to the outlet 16. The present invention is not limited to the deposition of the first wafers 20.

Referring to FIGS. 2 and 3, the step S3 is introducing the reacting gas F to the reactor 10. The reacting gas F is introduced into the reactor 10 from the inlet 14 and extracted from the reactor 10 from the outlet 16. The flow rate of the reacting gas F introduced to the reactor 10 is in the range of 0.1 sccm to 10 slm.

Next, the step S4 is heating the reactor 10. The reacting gas F reacts with the first wafers 20 and the second wafers 30. Then the first wafers 20 and the second wafers 30 are coated with a film. In addition, the input temperature T1 of the inlet 14 is about 400 to 950° C., and the output temperature T2 of the outlet 16 is about 400-950° C. In the present embodiment, the input temperature T1 is lower than the output temperature T2. However, in other embodiment, the input temperature T1 could higher than or equal to the output temperature T2.

The reacting gas F flows from the inlet 14 to the outlet 16, and from the surrounding region of the first wafers 20 and second wafers 30 to the geometric central. Thus, the flow rate of the reacting gas F in the inlet 14 is higher than the flow rate of the reacting gas F in the outlet 16. The flow rate of the reacting gas F in the surrounding region of the first wafers 20 and the second wafers 30 is higher than the flow rate of the reacting gas F in the geometric central of the first wafers 20 and the second wafers 30. The higher the flow rate of the reacting gas F, the higher the reaction rate is. That's to say, the reaction rate of the reaction gas F to the first wafers 20 and second wafers 30 in the surrounding region is higher than the reaction rate of the reaction gas F to the first wafers 20 and second wafers 30 in the geometric center.

In the prior art, the reacting rate of the reaction gas to the wafers in the surrounding region is higher than the reaction rate of the reaction gas to the wafers in the geometric center. Thus, the thickness of the film coating on the surrounding region of the wafers might higher than the thickness of the film coating on the geometric center of the wafers.

Nevertheless, in the present invention, the trenches 26 exist on the first back side 24 of the first wafers 20, and the maximum average distributed density of the trenches 26 is on the surrounding region B of the first back side 24. Thus, the reacting area of the reacting gas F to the surrounding region B of the first back side 24 is increased. In other words, the high flow rate of the reacting gas F in the surrounding region of the first wafers 20 and the second wafers 30 is react with the trenches 26 to coating a film on the trenches, so as to decrease the thickness of the film formed on the surround region of the first wafers 20 and the second wafers 30. In other words, the increase in surface area from center to edge on wafer backside produces a decrease in deposition rate from center to edge on the opposing wafer frontside to offset depletion related deposition rate profile non-uniformity.

On the other hand, the reacting gas F is reacted with the trenches 26 to coat a film on the trenches. Thus, the concentration of the reacting gas F in the surrounding region of the first right sides 22 and the second right sides 32 adjacent to the first wafers 20 is decreased. The thickness of the film coating on the first right sides 22 and the second right sides 32 adjacent to the first wafers 20 is decreased. The uniformity of the film on the first right sides 22 and the second right sides 32 is enhanced.

Moreover, the higher the temperature, the higher the reacting rate is. Thus, the thickness of the film is increased. That's to say, the uniformity of the film could also be adjusted by controlling the temperature of the reactor 10 and deposition of the trenches 26.

It's worth noting that the present invention is not limited to the number or the shape of the trenches 26. The number of the trenches 26 could be only one, and the shape of the trenches 26 could not be the circular trenches. On the other hand, the number of the trenches 26 is one, and the trenches 26 is spiral trenches. In addition, the circle center of the trenches 26 could be different. Also, the present invention is not limited to the average distributed density or the depth of the trenches 26. The shape, the average distributed density and the depth of the trenches 26 could be changed according to the thickness of the wafer, category of the wafer, the reaction condition (such as the reaction time and the reaction temperature) and the process requirement. The structure of trenches which could enhance the uniformity of the coating film on the trenches is included within the scope of the present invention.

On the other hand, in other embodiment, the first wafers 20 could be replaced by the partitions such as a metal plate. The structure of the partitions are similar to the above-mentioned the second wafers 30. Each of the partitions includes a pair of flat surfaces and a plurality of trenches. The pair of flat surfaces is corresponding to each other and includes a central region and a surrounding region. The trenches exist on one or both of the flat surfaces. The average distributed density of the trenches in the surrounding region is greater than the average distributed density of the trenches in the central region. The second right sides 32 of the second wafers 30 would face the flat surfaces with the trenches. The detail structure of the trenches is similar as the above-mentioned embodiment, and is omitted thereafter.

It's worth noting that the wafer coating method can be utilized in different kinds of film coating processes in the semiconductor industry. For instant, the insulating layer is coated on the wafer as the capacitor structure or the protecting layer. The wafer coating method of the present invention introduces a coating method to enhance the uniformity of the thickness of the insulating layer and the electric properties of the capacitor structure.

To sum up, the present embodiment provides a first wafer utilized in coating film and the wafer coating method. The first wafer includes a first right side, a first back side corresponding to the first right side, and a plurality of trenches distributed on the first back side. The first back side includes a surrounding region and a central region. The spacing between any two of the adjacent trenches in the surrounding region is smaller than the spacing between any two of the adjacent trenches in the central region.

In addition, the wafer coating method utilizing the above-mentioned first wafer includes deposing at least a first wafer (the first wafer is replaced by the partition made of metal) and a plurality of second wafers in the reactor to coating a film. A plurality of trenches exists in the back side of the first wafer. The spacing between any two of the adjacent trenches in the surrounding region is smaller than the spacing between any two of the adjacent trenches in the central region. Thus, in the process of coating film on the wafer, the structure of trenches could decrease the concentration of the reacting gas in the surrounding area of the first wafer and the second wafers and the reacting rate to form the film in the surrounding region of the second wafers. The uniformity of the film coated on the second wafers.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A first wafer, utilized in vapor deposition process for depositing films on a second wafer having an active side, comprising:
   a right side;
   a back side corresponding to the right side and face to the active side of the second wafer, comprising a central region and a surrounding region around the central region; and
   a plurality of trenches existing on the back side, wherein the spacing between any two of the adjacent trenches inside the surrounding region is smaller than the spacing between any two of the adjacent trenches insides the central region, configured to increase the reaction area for a reaction gas in the surrounding region, whereby the thickness of each film on the active side of the second wafer corresponding to the surrounding region of the back side is decreased.

2. The first wafer of claim 1, wherein the trenches are the circular trenches.

3. The first wafer of claim 1, wherein the average distributed density of the trenches is increased from the central region to the surrounding region.

4. The first wafer of claim 1, wherein the depth of the trenches are increased from the central region to the surrounding region.

5. The first wafer of claim 1, wherein the depth of the trenches are the same.

6. A first wafer, utilized in vapor deposition process for depositing films on a silicon wafer having an active side, comprising:
   a right side;
   a back side corresponding to the right side and face to the active side of the silicon wafer, comprising a central region and a surrounding region around the central region; and
   a plurality of trenches existing on the back side, wherein the average distributed density of the trenches in the surrounding region is greater than the average distributed density of the trenches in the central region, configured to increase the reaction area for a reaction gas in the surrounding region, whereby the thickness of each film on the active side of the silicon wafer corresponding to the surrounding region of the back side is decreased.

7. The first wafer of claim 6, wherein the trenches are the circular trenches.

8. The first wafer of claim 7, wherein the spacing between any two adjacent trenches inside the surrounding region is smaller than the spacing between any two adjacent trenches insides the central region.

9. The first wafer of claim 6, wherein the average density of the trenches is increased from the central region to the surrounding region.

10. The first wafer of claim 6, wherein the depth of the trenches are increased from the central region to the surrounding region.

11. The first wafer of claim 6, wherein the depth of the trenches are the same.

12. A wafer coating method, comprising:
providing a reactor, the reactor comprising an inlet and an outlet;
placing at least a first wafer and a plurality of second wafers into the reactor, the first wafer and the second wafer are arranged along the first axial,
wherein the first wafer comprises a first right side, a first back side corresponding to the first right side and a plurality of trenches, the first back side comprises a central region and a surrounding region, and the trenches are on the first back side,
wherein each of the second wafers comprises a second right side and a second back side corresponding to the second right side, and the second right side face to the first back side,
wherein the spacing between two adjacent trenches inside the surrounding region is smaller than the spacing between two adjacent trenches inside the central region; and
introducing a reacting gas from the inlet to the reactor, wherein the first wafer is configured to increase the reaction area for the reaction gas in the surrounding region, whereby the thickness of a film formed on the second right side of the second wafer is decreased.

13. The wafer coating method of claim 12, wherein the first wafer is deposing between two adjacent second wafers.

14. The wafer coating method of claim 12, wherein the trenches are circular trenches.

15. The wafer coating method of claim 12, wherein the average distributed density of the trenches in the surrounding region is greater than the average distributed density of the trenches in the central region.

16. The wafer coating method of claim 12, wherein the depth of the trenches are increased from the central region to the surrounding region.

17. The wafer coating method of claim 12, wherein the depth of the trenches are the same.

18. The wafer coating method of claim 12, wherein the average distributed density of the trenches is increased from the central region to the surrounding region.

* * * * *